United States Patent
Forster et al.

(10) Patent No.: US 9,355,819 B2
(45) Date of Patent: May 31, 2016

(54) ELONGATED CAPACITIVELY COUPLED PLASMA SOURCE FOR HIGH TEMPERATURE LOW PRESSURE ENVIRONMENTS

(71) Applicants: John C. Forster, Mountain View, CA (US); Joseph Yudovsky, Campbell, CA (US); Garry K. Kwong, San Jose, CA (US); Tai T. Ngo, Dublin, CA (US); Kevin Griffin, Livermore, CA (US); Kenneth S. Collins, San Jose, CA (US); Ren Liu, Sunnyvale, CA (US)

(72) Inventors: John C. Forster, Mountain View, CA (US); Joseph Yudovsky, Campbell, CA (US); Garry K. Kwong, San Jose, CA (US); Tai T. Ngo, Dublin, CA (US); Kevin Griffin, Livermore, CA (US); Kenneth S. Collins, San Jose, CA (US); Ren Liu, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 96 days.

(21) Appl. No.: 14/460,683

(22) Filed: Aug. 15, 2014

(65) Prior Publication Data
US 2015/0048739 A1 Feb. 19, 2015

Related U.S. Application Data

(60) Provisional application No. 61/867,020, filed on Aug. 16, 2013.

(51) Int. Cl.
*H01J 37/32* (2006.01)

(52) U.S. Cl.
CPC ..... *H01J 37/32091* (2013.01); *H01J 37/32357* (2013.01); *H01J 37/32513* (2013.01); *H01J 37/32541* (2013.01); *H01J 37/32568* (2013.01)

(58) Field of Classification Search
CPC ................ H01J 37/32; H01J 37/32091; H01J 37/32357; H01J 37/32451
USPC ..................................... 315/111.21
See application file for complete search history.

(56) References Cited

U.S. PATENT DOCUMENTS

| 5,186,718 | A | 2/1993 | Tepman et al. |
| 5,685,941 | A | 11/1997 | Forster et al. |
| 6,132,566 | A | 10/2000 | Hofmann et al. |
| 6,149,784 | A | 11/2000 | Su et al. |
| 6,176,981 | B1 | 1/2001 | Hong et al. |
| 6,190,513 | B1 | 2/2001 | Forster et al. |

(Continued)

FOREIGN PATENT DOCUMENTS

| JP | 2004-200429 | 7/2004 |
| KR | 10-2004-0102300 | 12/2004 |

OTHER PUBLICATIONS

PCT International Search Report and Written Opinion in PCT/US2014/051274, mailed Nov. 26, 2014, 10 pages.

(Continued)

*Primary Examiner* — Don Le
(74) *Attorney, Agent, or Firm* — Servilla Whitney LLC

(57) ABSTRACT

A modular plasma source assembly for use with a processing chamber is described. The assembly includes an RF hot electrode with an end dielectric and a sliding ground connection positioned adjacent the sides of the electrode. A seal foil connects the sliding ground connection to the housing to provide a grounded sliding ground connection separated from the hot electrode by the end dielectric. A coaxial feed line passes through a conduit into the RF hot electrode isolated from the processing environment so that the coaxial RF feed line is at atmospheric pressure while the plasma processing region is at reduced pressure.

20 Claims, 7 Drawing Sheets

(56) References Cited

U.S. PATENT DOCUMENTS

| | | |
|---|---|---|
| 6,203,620 B1 | 3/2001 | Moslehi |
| 6,228,229 B1 | 5/2001 | Raaijmakers et al. |
| 6,264,812 B1 | 7/2001 | Raaijmakers et al. |
| 6,297,595 B1 | 10/2001 | Stimson et al. |
| 6,461,483 B1 | 10/2002 | Gopalraja et al. |
| 6,486,431 B1 | 11/2002 | Smith et al. |
| 6,565,717 B1 | 5/2003 | Leet et al. |
| 6,632,324 B2 | 10/2003 | Chan |
| 6,815,633 B1 | 11/2004 | Chen et al. |
| 7,396,431 B2 | 7/2008 | Chen et al. |
| 2003/0216037 A1 | 11/2003 | Zhang et al. |
| 2004/0083971 A1 | 5/2004 | Holland et al. |
| 2004/0159287 A1 | 8/2004 | Hoffman et al. |
| 2004/0238488 A1 | 12/2004 | Choi et al. |
| 2006/0065367 A1 | 3/2006 | Chen et al. |
| 2007/0212896 A1 | 9/2007 | Olsen et al. |
| 2008/0044960 A1 | 2/2008 | Al-Bayati et al. |
| 2009/0159425 A1 | 6/2009 | Liu et al. |
| 2009/0200269 A1* | 8/2009 | Kadkhodayan ....... C23C 14/564 216/71 |
| 2012/0073756 A1 | 3/2012 | Yamazawa et al. |
| 2014/0178604 A1* | 6/2014 | Selwyn ............. H01J 37/32422 427/562 |
| 2015/0083042 A1* | 3/2015 | Kobayashi ........ H01L 21/68792 118/500 |

OTHER PUBLICATIONS

PCT International Preliminary Report on Patentability in PCT/US2014/051274, mailed Feb. 25, 2016, 7 pages.

* cited by examiner

ELONGATED CAPACITIVELY COUPLED PLASMA SOURCE FOR HIGH TEMPERATURE LOW PRESSURE ENVIRONMENTS

CROSS-REFERENCE TO RELATED APPLICATIONS

This application claims priority to U.S. Provisional Application No. 61/867,020, filed Aug. 16, 2013.

BACKGROUND

Embodiments of the invention generally relate to an apparatus for processing substrates. More particularly, embodiments of the invention relate to modular capacitively coupled plasma sources for use with processing chambers like batch processors.

Semiconductor device formation is commonly conducted in substrate processing platforms containing multiple chambers. In some instances, the purpose of a multi-chamber processing platform or cluster tool is to perform two or more processes on a substrate sequentially in a controlled environment. In other instances, however, a multiple chamber processing platform may only perform a single process on substrates; the additional chambers are intended to maximize the rate at which substrates are processed by the platform. In the latter case, the process performed on substrates is typically a batch process, wherein a relatively large number of substrates, e.g. 25 or 50, are processed in a given chamber simultaneously. Batch processing is especially beneficial for processes that are too time-consuming to be performed on individual substrates in an economically viable manner, such as for atomic layer deposition (ALD) processes and some chemical vapor deposition (CVD) processes.

The effectiveness of a substrate processing platform, or system, is often quantified by cost of ownership (COO). The COO, while influenced by many factors, is largely affected by the system footprint, i.e., the total floor space required to operate the system in a fabrication plant, and system throughput, i.e., the number of substrates processed per hour. Footprint typically includes access areas adjacent the system that are required for maintenance. Hence, although a substrate processing platform may be relatively small, if access is required from all sides for operation and maintenance, the system's effective footprint may still be prohibitively large.

Capacitively coupled plasma sources are well known, and greatly utilized in semiconductor manufacturing. When operating such a source at medium pressures (1-25 Torr), control of the gaps between RF hot electrodes and grounded surfaces can be important to avoid ignition of stray plasmas. Even small gaps between insulators can "light up" if the electric field is sufficient. The ignition of a plasma depends on the product between pressure and gap distance, illustrated by the Paschen curve in FIG. 1. The ignition voltage is at a minimum when the product between pressure and gap distance is on the order of 1-10 Torr-cm. For the 1-25 Torr pressure range of interest, the lowest ignition voltage will be in gaps of 0.4 mm-1 cm. To avoid spurious plasmas, gaps might be controlled on the order of 0.25 mm. For experienced mechanical designers, this is easy to achieve. However, for some applications, the structure of the plasma source may need to operate between room temperature and an elevated temperature (e.g., 200° C.). The need to accommodate thermal expansion will require new designs to control gaps, and avoid spurious plasmas.

Therefore, there is a need in the art for modular capacitively coupled plasma sources for use with batch reactors.

SUMMARY

One or more embodiments of the invention are directed to a modular plasma source assembly comprising an elongate housing, and elongate RF hot electrode, an end dielectric, a sliding ground connection, a seal foil and a coaxial RF feed line. The elongate housing has a side wall, an electrically grounded front face and a gas volume. The elongate RF hot electrode is within the housing and has a front face, a back face, elongate sides and a first end and a second end defining an elongate axis. The elongate RF hot electrode is spaced from the front face to form a gap between the front face of the RF hot electrode and the front face of the elongate housing. The end dielectric is in contact with each of the first end and the second end of the RF hot electrode and between the RF hot electrode and the side wall. The sliding ground connection is positioned at one or more of the first end and the second end of the RF hot electrode opposite the end dielectric. The sliding ground connection is isolated from direct contact with the RF hot electrode by the end dielectric. The seal foil is positioned at each sliding ground connection opposite the end dielectric. The seal foil forms an electrical connection between the front face of the elongate housing and the sliding ground connection. The coaxial RF feed line passes through the elongate housing and includes an outer conductor and an inner conductor separated by an insulator. The outer conductor is in communication with electrical ground and the inner conductor is in electrical communication with the elongate RF hot electrode.

Additional embodiments of the invention are directed to modular plasma source assembly comprising an elongate housing, an elongate RF hot electrode within the housing, a dielectric spacer, a grounded plate and a coaxial RF feed line. The elongate housing has a side wall, an electrically grounded front face and a gas volume. The elongate RF hot electrode has a front face, a back face, elongate sides and a first end and a second end defining an elongate axis. The elongate RF hot electrode is spaced from the front face to form a gap between the front face of the RF hot electrode and the front face of the elongate housing. The dielectric spacer is within the housing and positioned adjacent the back face of the elongate RF hot electrode. The grounded plate is within the housing and is positioned on an opposite side of the dielectric spacer from the RF hot electrode and is connected to electrical ground. A channel extends through the grounded plate and the dielectric spacer. The coaxial RF feed line passes through the elongate housing and includes an outer conductor and an inner conductor separated by an insulator. The outer conductor is in electrical communication with grounded plate and the inner conductor passes through the channel in the grounded plate and the dielectric spacer and is in electrical communication with the elongate RF hot electrode. The channel is at atmospheric pressure when the gap is at reduced pressure.

A further embodiment is directed to a modular plasma source assembly comprising a wedge-shaped elongate housing; a wedge-shaped RF hot electrode, an end dielectric, a sliding ground connection, a seal foil and a coaxial RF feed line. The wedge-shaped elongate housing includes an inner peripheral end, an outer peripheral end, two side walls connecting the inner peripheral end and the outer peripheral end, an electrically grounded front face comprising a plurality of openings therethrough and a gas volume. The wedge-shaped RF hot electrode is within the housing and has a body with a front surface, a back surface, elongate sides, a first end adjacent the inner peripheral end and a second end adjacent the outer peripheral end, the front surface of the RF hot electrode spaced from the front face of the housing to form a gap. The end dielectric is in contact with each of the first end and the second end of the RF hot electrode. The sliding ground connection is positioned at the second end of the RF hot electrode opposite the end dielectric and is isolated from direct contact with the RF hot electrode by the end dielectric. The seal foil is positioned adjacent the sliding ground connection opposite the end dielectric and forms an electrical connection between the front face of the elongate housing and the sliding ground connection. The RF feed line passes through the elongate housing and includes an outer conductor and an inner conductor separated by an insulator. The outer conductor is in communication with electrical ground and the inner conductor is in electrical communication with the RF hot electrode.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

Figure 1:
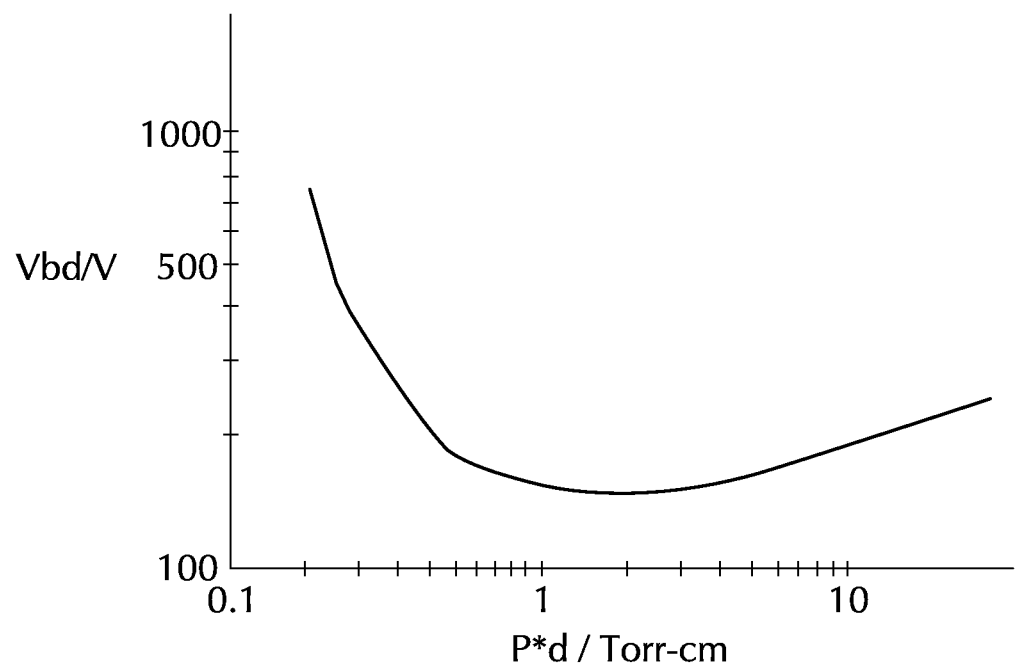
FIG. 1 shows the Paschen curve for argon.

Embodiments of the invention provide a substrate processing system for continuous substrate deposition to maximize throughput and improve processing efficiency. The substrate processing system can also be used for pre-deposition and post-deposition plasma treatments.

As used in this specification and the appended claims, the term "substrate" and "wafer" are used interchangeably, both referring to a surface, or portion of a surface, upon which a process acts. It will also be understood by those skilled in the art that reference to a substrate can also refer to only a portion of the substrate, unless the context clearly indicates otherwise. Additionally, reference to depositing on a substrate can mean both a bare substrate and a substrate with one or more films or features deposited or formed thereon.

As used in this specification and the appended claims, the terms "reactive gas", "precursor", "reactant", and the like, are used interchangeably to mean a gas that includes a species which is reactive with a substrate surface. For example, a first "reactive gas" may simply adsorb onto the surface of a substrate and be available for further chemical reaction with a second reactive gas.

Rotating platen chambers are being considered for many applications. In such a chamber, one or more wafers are placed on a rotating holder ("platen"). As the platen rotates, the wafers move between various processing areas. For example, in ALD, the processing areas would expose the wafer to precursor and reactants. In addition, plasma exposure may be necessary to properly treat the film or the surface for enhanced film growth, or to obtain desirable film properties. Some embodiments of the invention provide for uniform deposition and post-treatment (e.g., densification) of ALD films when using a rotating platen ALD chamber.

Rotating platen ALD chambers can deposit films by traditional time-domain processes where the entire wafer is exposed to a first gas, purged and then exposed to the second gas, or by spatial ALD where portions of the wafer are exposed to the first gas and portions are exposed to the second gas and the movement of the wafer through these gas streams deposits the layer.

Embodiments of the invention can be used with either a linear processing system or a rotational processing system. In a linear processing system, the width of the area that the plasma exits the housing is substantially the same across the entire length of front face. In a rotational processing system, the housing may be generally "pie-shaped" or "wedge-shaped". In a wedge-shaped segment, the width of the area that the plasma exits the housing changes to conform to a pie shape. As used in this specification and the appended claims, the terms "pie-shaped" and "wedge-shaped" are used interchangeably to describe a body that is a generally circular sector. For example, a wedge-shaped segment may be a fraction of a circle or disc-shaped object. The inner edge of the pie-shaped segment can come to a point or can be truncated to a flat edge or rounded. The path of the substrates can be perpendicular to the gas ports. In some embodiments, each of the gas injector assemblies comprises a plurality of elongate gas ports which extend in a direction substantially perpendicular to the path traversed by a substrate. As used in this specification and the appended claims, the term "substantially perpendicular" means that the general direction of movement of the substrates is along a plane approximately perpendicular (e.g., about 45° to 90°) to the axis of the gas ports. For a wedge-shaped gas port, the axis of the gas port can be considered to be a line defined as the mid-point of the width of the port extending along the length of the port.

Figure 2:
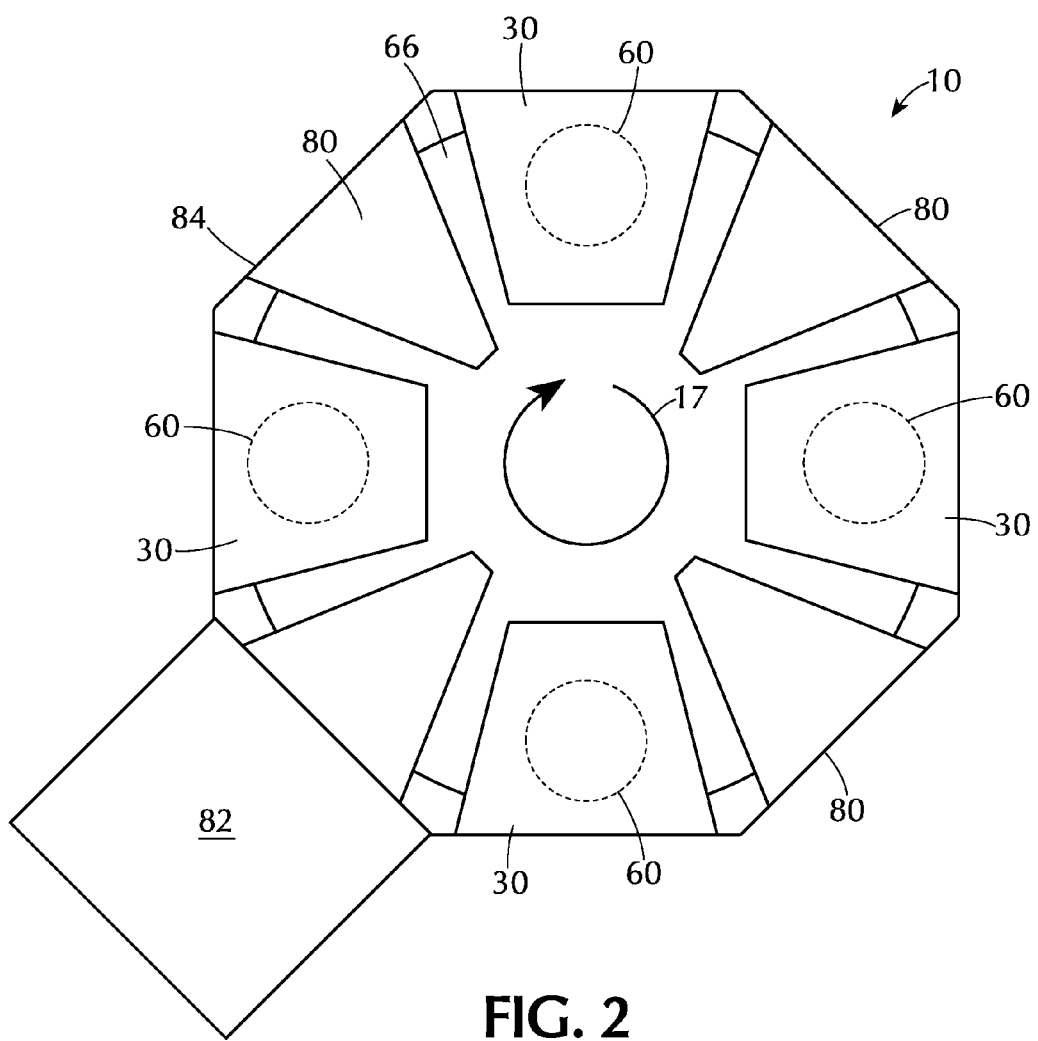
FIG. 2 shows a schematic plan view of a substrate processing system configured with four gas injector assemblies and four capacitively coupled wedge-shaped plasma sources with a loading station in accordance with one or more embodiments of the invention.

Processing chambers having multiple gas injectors can be used to process multiple wafers simultaneously so that the wafers experience the same process flow. For example, as shown in FIG. 2, the processing chamber 10 has four gas injector assemblies 30 and four wafers 60. At the outset of processing, the wafers 60 can be positioned between the injector assemblies 30. Rotating the susceptor 66 of the carousel by 45° will result in each wafer 60 being moved to an injector assembly 30 for film deposition. An additional 45° rotation would move the wafers 60 away from the injector assemblies 30. This is the position shown in FIG. 2. With spatial ALD injectors, a film is deposited on the wafer during movement of the wafer relative to the injector assembly. In some embodiments, the susceptor 66 is rotated so that the wafers 60 do not stop beneath the injector assemblies 30. The number of wafers 60 and gas injector assemblies 30 can be the same or different. In some embodiments, there are the same numbers of wafers being processed as there are gas injector assemblies. In one or more embodiments, the number of wafers being processed are an integer multiple of the number of gas injector assemblies. For example, if there are four gas injector assemblies, there are 4x wafers being processed, where x is an integer value greater than or equal to one.

The processing chamber 10 shown in FIG. 2 is merely representative of one possible configuration and should not be taken as limiting the scope of the invention. Here, the processing chamber 10 includes a plurality of gas injector assemblies 30. In the embodiment shown, there are four gas injector assemblies 30 evenly spaced about the processing chamber 10. The processing chamber 10 shown is octagonal, however, it will be understood by those skilled in the art that this is one possible shape and should not be taken as limiting the scope of the invention. The gas injector assemblies 30 shown are rectangular, but it will be understood by those skilled in the art that the gas injector assemblies can be wedge-shaped segments, like plasma sources 80. An option for a plasma source is a capacitively coupled plasma. Such plasmas have high plasma density and low plasma potentials. A capacitively coupled plasma is generated via RF currents in conductors. The RF carrying conductors may be separated from the plasma via a dielectric window, minimizing the possibility of metallic contamination of the film.

The processing chamber 10 includes a substrate support apparatus, shown as a round susceptor 66 or susceptor assembly or platen. The substrate support apparatus, or susceptor 66, is capable of moving a plurality of wafers 60 beneath each of the gas injector assemblies 30. A load lock 82 might be connected to a side of the processing chamber 10 to allow the substrates (also referred to as wafers 60) to be loaded/unloaded from the chamber 10.

In some embodiments, the processing chamber 10 comprises a plurality of gas curtains (not shown) positioned between the gas injector assemblies 30 (also called gas distribution plates or gas distribution assemblies) and the plasma sources 80. Each gas curtain creates a barrier to prevent, or minimize, diffusion of processing gases into other regions of the processing chamber. For example, a gas curtain can prevent or minimize the diffusion of reactive gases from gas injector assemblies 30 from migrating from the gas distribution assembly regions to the plasma source 80 regions and vice versa. The gas curtain can include any suitable combination of gas and/or vacuum streams which can isolate the individual processing sections from the adjacent sections. In some embodiments, the gas curtain is a purge (or inert) gas stream. In one or more embodiments, the gas curtain is a vacuum stream that removes gases from the processing chamber. In some embodiments, the gas curtain is a combination of purge gas and vacuum streams so that there are, in order, a purge gas stream, a vacuum stream and a purge gas stream. In one or more embodiments, the gas curtain is a combination of vacuum streams and purge gas streams so that there are, in order, a vacuum stream, a purge gas stream and a vacuum stream.

Some atomic layer deposition systems use a modular plasma source, i.e. a source that can be easily inserted into the system. Such a source will have all or most of its hardware operating at the same pressure level as the atomic layer deposition process, typically 1-50 Torr. Briefly, the plasma sources according to one or more embodiments include a main RF feed that is held at atmospheric pressure. This eliminates possibility of spurious plasma ignition in the coaxial feed. The RF hot electrode creates the plasma in a 8.5 mm gap (the gap can range from 3 mm to 25 mm) between said hot electrode and a grounded electrode.

The upper portion of the electrode is covered by a thick dielectric (e.g., ceramic), which in turn is covered by a grounded surface. The RF hot electrodes, and grounded structure, are made of a good conductor, such as aluminum. To accommodate thermal expansion, two pieces of dielectric (e.g. ceramic) are placed at the long ends of the RF hot electrode. For example, grounded Al pieces are placed adjacent to the dielectric, without a gap between. The grounded pieces can slide inside the structure, and are held against the ceramic with springs. The springs compress the entire "sandwich" of grounded Al/dielectric against the RF hot electrode without any gaps, eliminating or minimizing the chance of spurious plasma. The RF hot electrode can be, for example, thick ceramic and the ground plate are held together by springs that push down on the ground plate. This holds the parts together, eliminating gaps, yet still allows some sliding due to thermal expansion.

The coaxial RF feed may be constructed so that the outer conductor terminates on the grounded plate. The inner conductor can terminate on the RF hot plate. Since the feed is at atmospheric pressure, there may be O-rings at the bottom of the feed structure to enable medium pressure inside the source. Gas can be fed to the source around the outside periphery of the coaxial feed.

In order to reach the plasma volume, the ground plate, thick ceramic, and RF hot plate might be perforated with through holes. The size of the holes can be small enough to prevent ignition inside the holes. For the ground plate and RF hot plate, the hole diameter of some embodiments is <1 mm, for example about 0.5 mm. The high electric fields inside the dielectric mean that the system is designed to eliminate chances of stray plasma in the holes. The thick dielectric may be split into three layers. Each layer has 0.75 mm diameter through holes that are offset from the holes in the adjacent layers. A 0.5 mm gap is machined into the layers to allow gas to flow between the offset holes.

The RF feed may be in the form of a coaxial transmission line. The outer conductor is connected/terminated in the grounded plate, and the inner conductor is connected to the RF hot plate. The grounded plate can be connected to the metal enclosure or housing by any suitable method including, but not limited to, a metal gasket. This helps to ensure a symmetric geometry of the return currents. All return currents flow up the outer conductor of the feed, minimizing RF noise.

Figure 3:
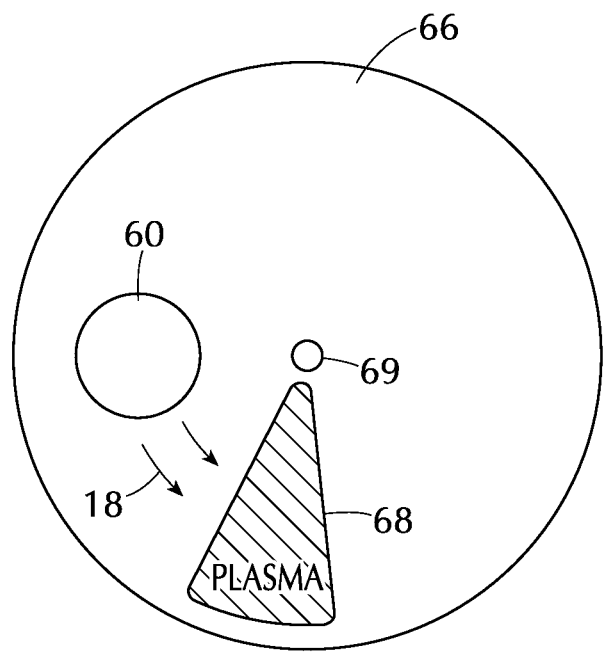
FIG. 3 shows a schematic of a platen rotating a wafer through a pie-shaped plasma region in accordance with one or more embodiment of the invention.

The plasma source of one or more embodiments can be rectangular in shape or can be configured to other shapes. For a spatial ALD application utilizing a rotating wafer platen, the shape may be a truncated wedge, as shown in FIG. 3. The design retains the atmospheric coaxial RF feed and the dielectric layers with offset gas feed holes. The plasma uniformity can be tuned by adjusting the spacing between the RF hot plate and the grounded exit plate, and by adjusting the location of the RF feedpoint.

In some embodiments, the source is operated at medium pressure (1-25 Torr), yet the coaxial feed is kept at atmospheric pressure. In one or more embodiments, two O-rings and features in the dielectric isolator provide vacuum seal.

In some embodiments, the gas feed is through perforations or holes in the ground plate, RF hot plate and dielectric isolator. The dielectric isolator of some embodiments is split into three layers. The holes in the dielectric layers may be offset from each other, and there may be thin setbacks between layers to allow gas to flow between the offset holes. The offset holes in the dielectric layers minimize the chance of ignition. The gas feed to the source assembly occurs around the outside periphery of the outer conductor of the coaxial RF feed.

In some embodiments, the RF feed is designed to provide symmetric RF feed current to the hot plate, and symmetric return currents. All return currents flow up the outer conductor, minimizing RF noise, and minimizing impact of source installation on operation.

Referring to FIGS. 4 through 8, one or more embodiments of the invention are directed to modular capacitively coupled plasma sources 100. As used in this specification and the appended claims, the term "modular" means that plasma source 100 can be attached to or removed from a processing chamber. A modular source can generally be moved, removed or attached by a single person and may have a weight less than about 25 lbs, 20 lbs, 15 lbs or 10 lbs.

The plasma source 100 includes a housing 110 with a front face 112 and a gas volume 113. The front face 112 is electrically grounded and, in conjunction with the hot electrode 120 forms a plasma in a gap 116. The front face 112 has a thickness with a plurality of apertures 114 extending therethrough to allow a plasma ignited in the gap 116 to pass through the apertures 114 into a processing region on an opposite side of the front face 112 from the gap 116. The housing 110 can be elongate housing, which means that, when looking at the face of the front face 112, there is a long axis and a short axis. For example, a rectangle having two long sides and two short sides would create an elongate shape with an elongate axis extending between the two long sides.

The plasma source 100 includes an elongate RF hot electrode 120. This electrode 120 is also referred to as the "hot electrode", "RF hot", and the like. The elongate RF hot electrode 120 has a front face 121, a back face 122 and elongate sides 123. The hot electrode 120 also includes a first end 124 and second end 125 which define the elongate axis. The elongate RF hot electrode 120 is spaced from the front face 112 of the housing so that a gap 116 is formed between the front face 121 of the hot electrode 120 and the front face 112 of the housing 110. The elongate RF hot electrode 120 can be made of any suitable conductive material including, but not limited to, aluminum.

Figure 4:
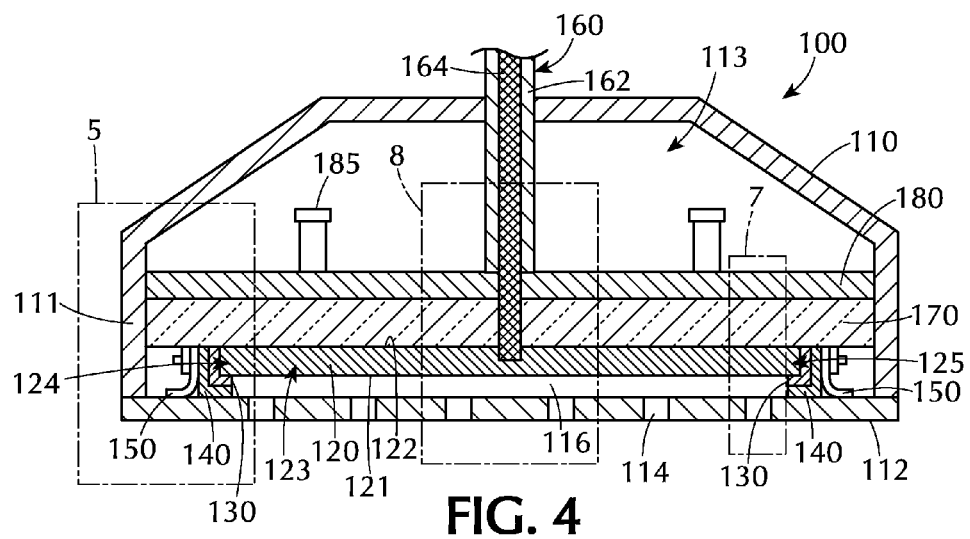
FIG. 4 shows a schematic of a plasma source assembly in accordance with one or more embodiment of the invention.
Figure 5:
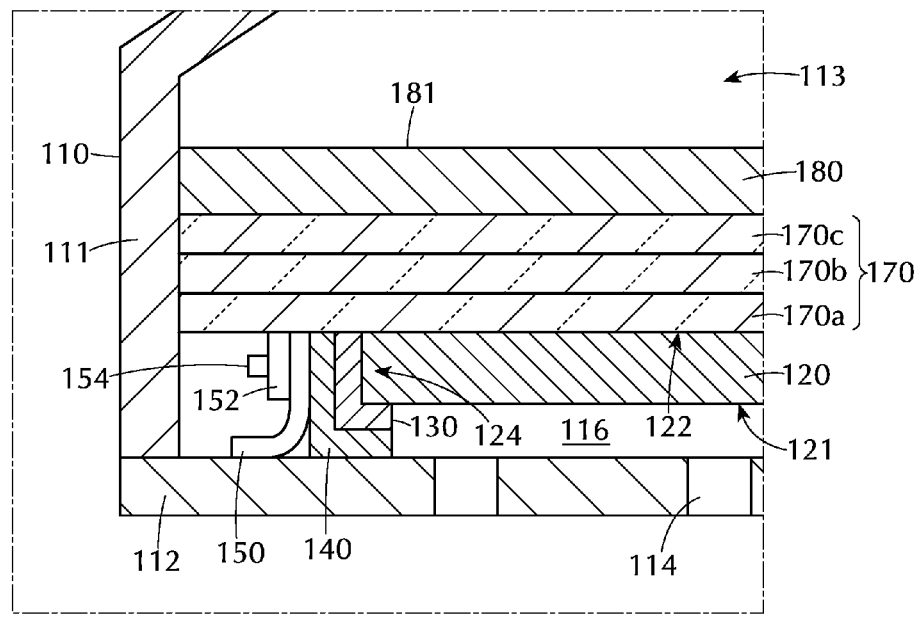
FIG. 5 shows an expanded view of a portion of the plasma source assembly FIG. 4.
Figure 6:
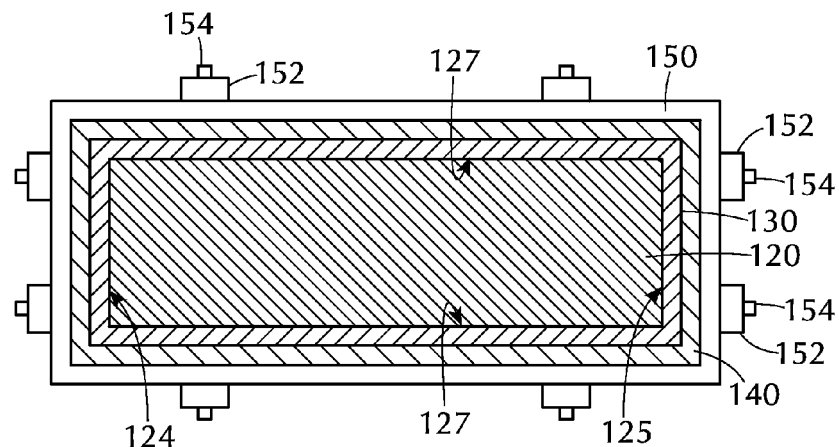
FIG. 6 shows a schematic view of a portion of a plasma source assembly in accordance with one or more embodiment of the invention.

As shown in the expanded view of FIG. 5, some embodiments include an end dielectric 130 in contact with one or more of the first end 124 and the second end 125 of the RF hot electrode 120. The end dielectric 130 forms are positioned between the RF hot electrode 120 and the side wall 111 of the housing 110. In one or more embodiments, the end dielectric 130 is in contact with both the first end 124 and the second end 125 of the hot electrode 120. FIGS. 4 and 5 show cross-sectional views of the plasma source 100. FIG. 6 shows a front view of a rectangular elongate RF hot electrode 120 showing the elongate shape. The left end (first end 124) and right end (second end 125) of the hot electrode 120 have an end dielectric 130 adjacent thereto. However, there are also front end 126 and back end 127 also with end dielectric 130 adjacent thereto. The end dielectric 130 can be made out of any suitable dielectric material including, but not limited to ceramic. The end dielectric 130 shown in the Figures is L-shaped, but any suitable shape can be used.

A sliding ground connection 140 is positioned at one or more of the first end 124 and the second end 125 of the RF hot electrode 120. The sliding ground connection 140 is positioned on an opposite side of the end dielectric 130 from the hot electrode 120. The sliding ground connection 140 is isolated from direct contact with the RF hot electrode 120 by the end dielectric 130. The sliding ground connection 140 and the end dielectric 130 cooperate to maintain a gas tight seal and allow the hot electrode 120 to expand without allowing leakage of gases around the side of the electrode. The sliding ground connection 140 is a conductive material and can be made of any suitable material including, but not limited to, aluminum. The sliding ground connection 140 provides a grounded termination to the side of the end dielectric 130 to ensure that there is no electric field in the gap 116, minimizing the chance of stray plasma in the gap 116.

A seal foil 150 is positioned at the sliding ground connection 140 on an opposite side from the end dielectric 130. The seal foil 150 forms an electrical connection between the front face 112 of the housing 110 and the sliding ground connection 140 as the sliding ground connection 140 slides on the front face 112. The seal foil 150 can be made from any suitable conductive material including, but not limited to, aluminum. The seal foil 150 can be a thin flexible material that can move with the expansion and contraction of the hot electrode 120 so long as the electrical connection between the front face and the sliding ground connection is maintained.

Referring to FIG. 5, which shows one end of the plasma source 100, a clamp face 152 and nut 154 are positioned at the end of the hot electrode 120, end dielectric 130, sliding ground connection 140 and seal foil 150 combination. Other clamp faces 152 and nuts 154 can be found at any side of the combination and multiple can be found along each side of the combination, depending on the size and shape of the plasma source. The clamp face 152 and nut 154 provide inwardly directed pressure to the combination of components to form a tight seal and prevent separation between the end dielectric 130 and the sliding ground connection 140 which might allow plasma gases to get behind the hot electrode 120. The clamp face 152 and nut 154 can be made from any suitable material including, but not limited to, aluminum and stainless steel.

In some embodiments, a dielectric spacer 170 is positioned adjacent the back face 122 of the elongate RF hot electrode 120. The dielectric spacer 170 can be made of any suitable dielectric material including, but not limited to, ceramic materials. The dielectric spacer 170 provides a non-conductive separator between the RF hot electrode 120 and the top portion of the housing 110. Without this non-conductive separator, there is a chance that a plasma could be formed in the gas volume 113 due to capacitive coupling between the RF hot electrode 120 and the housing 110.

The dielectric spacer 170 can be any suitable thickness and made up of any number of individual layers. In the embodiment shown in FIG. 4, the dielectric spacer 170 is made up of one layer. In an alternate embodiment shown in FIGS. 5, 7 and 8, the dielectric spacer 170 comprises three individual dielectric spacer sub-layers 170a, 170b, 170c. The combination of these sub-layers makes up the total thickness of the dielectric spacer 170. Each of the individual sub-layers can be the same thickness or each can have an independently determined thickness.

Above the dielectric spacer 170, in some embodiments, is a grounded plate 180 positioned within the housing 110 and on an opposite side of the dielectric spacer 170 from the RF hot electrode 120. The grounded plate 180 is made of any suitable electrically conductive material including, but not limited to, aluminum, which can be connected to electrical ground. This grounded plate 180 further isolates the RF hot electrode 120 from the gas volume 113 to prevent plasma formation in the gas volume 113 or in a region other than the gap 116 where the plasma is intended to be formed.

Although the Figures show the grounded plate 180 to be about the same thickness as the dielectric spacer 170, or the sum of the individual dielectric spacer layers, this is merely one possible embodiment. The thickness of the grounded plate 180 can be any suitable thickness depending on the specific configuration of the plasma source. The thickness of the grounded plate in some embodiments is chosen based on, for example, thin enough to make drilling of gas holes easier, but thick enough to withstand the forces of the various springs mentioned. Additionally, the thickness of the grounded plate 180 may be tuned to ensure that the coaxial feed, which is typically a welded connection, can be adequately attached.

Some embodiments of the invention include a plurality of compression elements 185. The compression elements 185 direct force against a back surface 181 of the grounded plate 180 in the direction of the RF hot electrode 120. The compressive force causes the grounded plate 180, dielectric spacer 170 and RF hot electrode 120 to be pressed together to minimize or eliminate any spacing between each adjacent component. The compressive force helps prevent gases from flowing into the space being the RF hot electrode where they may become stray plasma. Suitable compression elements 185 are those which can be adjusted or tuned to provide a specific force to the back surface 181 of the grounded plate 180 and include, but are not limited to, springs and screws.

Figure 7:
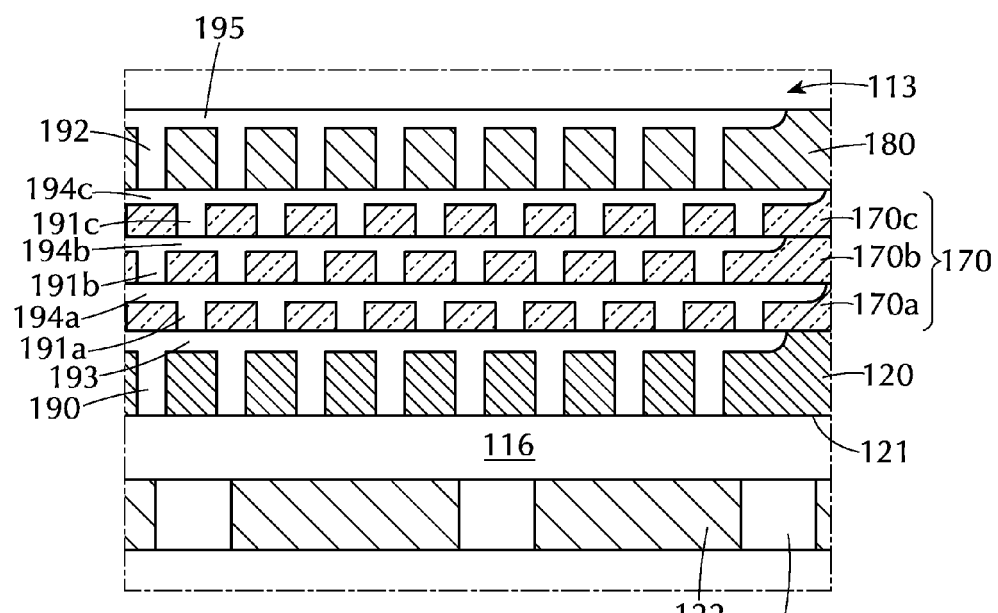
FIG. 7 shows an expanded view of a portion of the plasma source assembly of FIG. 4.

With reference to FIG. 7, some embodiments of the invention include a plurality of holes 190, 191a, 191b, 191c, 192 extending through one or more of the grounded plate 180, dielectric spacer 170 and RF hot electrode 120. While the embodiment of FIG. 7 shows a dielectric spacer 170 having three layers 170a, 170b, 170c, it will be understood that there can be any number of dielectric spacer 170 layers, and that this is merely one possible configuration. The holes allow a gas to move from the gas volume 113 to the gap 116 adjacent the front face 121 of the RF hot electrode 120.

In the embodiment shown in FIG. 7, the plurality of holes 190 in the RF hot electrode 120 are offset from the plurality of holes 191a in the first layer of the dielectric spacer 170a which are offset from the plurality of holes 191b in the second layer of the dielectric spacer 170b which are offset from the plurality of holes 191c in the third layer of the dielectric spacer 170c which are offset from the plurality of holes 192 in the grounded plate 180. This offset pattern helps prevent or minimize the possibility of stray plasma forming outside of the gap 116 because there is no direct line between the RF hot electrode 120 and the grounded plate 180 or the gas volume 113. Without being bound by any particular theory of operation, it is believed that the sub-layers minimize the chance of ignition of a plasma in the gas feed holes. The thickness of the dielectric spacer 170 may be chosen so that the product of pressure and thickness is as far away from the minimum in the Paschen curve of FIG. 1 as possible, within practical limits. Because the holes in each sub-layer are offset from the holes in the other sub-layers, the breakdown characteristics of each sub-layer can be analyzed separately.

A channel 193, 194a, 194b, 194c, 195 can be formed in each of the back face 122 of the RF hot electrode 120 and the back face of each layer of the dielectric spacer 170. This allows the gas flowing from the adjacent plurality of holes to be in fluid communication with the plurality of holes in the adjacent component. A channel 195 is shown in the back surface 181 of the grounded plate 180, but it will be understood that this channel 195 is not necessary to provide fluid communication between the gas volume 113 and the gap 116.

The size of the plurality of holes 190, 191a, 191b, 191c, 192 can vary and has an impact of the flow rate of gas from the gas volume 113 to the gap 116. Larger diameter holes will allow more gas to flow through than smaller diameter holes. However, larger diameter holes may also make ignition of stray plasma within the holes possible or more likely. In some embodiments, each of the plurality of holes 190, 191a, 191b, 191c, 192 independently has a diameter less than about 1.5 mm, or less than about 1.4 mm, or less than about 1.3 mm, or less than about 1.2 mm, or less than about 1.1 mm or less than about 1 mm.

Similarly, the depth of the channel 193, 194, 195 can also impact the flow rate of gas and likelihood of stray plasma formation. In some embodiments, each of the channels 193, 194, 195 independently has a depth of less than about 1 mm, or less than about 0.9 mm, or less than about 0.8 mm, or less than about 0.7 mm or less than about 0.6 mm, or less than about 0.5 mm, or about 0.5 mm. The depth of each individual channel is measured from the back surface of the respective component. For example, the depth of the channel 195 in the grounded plate 180 is measured from the back surface 181 of the grounded plate 180. In some embodiments, the plurality of holes 190, 191a, 191b, 191c passing through each of the dielectric spacer layers 170a, 170b, 170c and the RF hot electrode 120 have diameters greater than the depth of the channel 193, 194a, 194b, 194c in the respective component.

Figure 8:
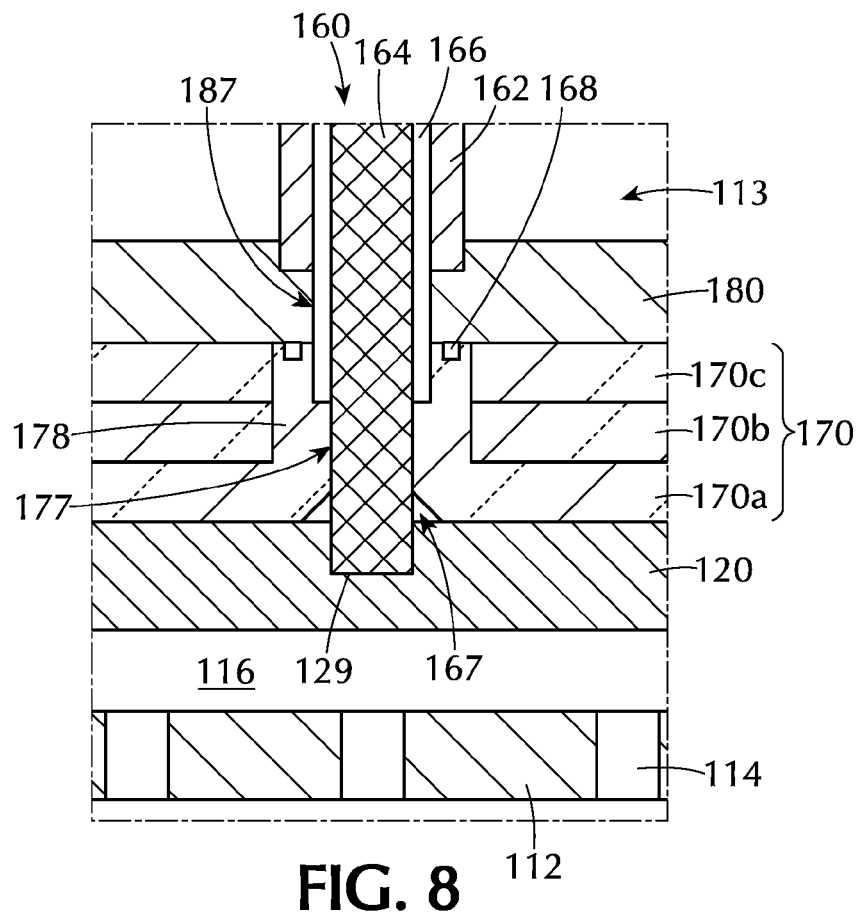
FIG. 8 shows an expanded view of a portion of the plasma source assembly of FIG. 4.

Referring to FIGS. 4 and 8, a coaxial RF feed line 160 passes through the elongate housing 110 and provides power for the RF hot electrode 120 to generate the plasma in the gap 116. The coaxial RF feed line 160 includes an outer conductor 162 and an inner conductor 164 separated by an insulator 166. The outer conductor 162 is in electrical communication with electrical ground and the inner conductor 164 is in electrical communication with the elongate RF hot electrode 120. As used in this specification and the appended claims, the term "electrical communication" means that the components are connected either directly or through an intermediate component so that there is little electrical resistance.

FIG. 8 shows one embodiment of the invention in which the outer conductor 164 of the coaxial RF feed line 160 is connected to the grounded plate 180 and the inner conductor 162 is connected to the RF hot electrode 120. The inner conductor 162 extends through a conduit 187 in the grounded plate 180, a conduit 177 in the dielectric spacer 170 into a recess 129 in the RF hot electrode 120 where electric connection with the RF hot electrode 120 is made. The insulator 166 extends through the conduit 187 in the grounded plate 180 and at least partially through the conduit 177 in the dielectric spacer 170 to maintain electrical separation of the inner conductor 164 and the outer conductor 162.

In the embodiment shown in FIG. 8, the bottom layer of the dielectric spacer 170a is shaped differently from the layers above. Here, the bottom layer of the dielectric spacer 170a has a vertical portion 178 through which the conduit 177 is formed. This vertical portion 178 is purely optional and may help ensure that there is a unified dielectric material between the RF hot electrode 120 and the grounded plate 180 by providing only a single surface through which the conduit 177 extends.

The region where the recess 129 in the RF hot electrode 120 aligns with the conduit 177 in the dielectric spacer 170 is sealed with an RF hot electrode vacuum seal 167. The RF hot electrode vacuum seal 167 extends around the inner conductor 164 at the connection to the elongate RF hot electrode 120 and acts as an O-ring to seal the space between the components. The RF hot electrode vacuum seal 167 can be made of any suitable material including, but not limited to, a compressible material. Those skilled in the art will understand that high temperatures and/or corrosive gases may benefit from different O-ring materials and the proper dimensioning for the O-ring capture grooves (the groove that the O-ring sits in) and sealing surfaces (the surface that presses onto the O-ring). The interface between the vertical portion 178 of the dielectric spacer 170a and the grounded plate 180 has a dielectric vacuum seal 168 around the conduit to form a seal between the grounded plate 180 and the dielectric spacer 170. If there were multiple layers of dielectric spacer without the vertical portion 178 on the bottom layer, each interface might include a sealing ring, or O-ring, to ensure that there is a pressure tight environment around the coaxial RF feed line 160. This gas-tight environment allows the coaxial RF feed line 160 to be at atmospheric pressure while the gap 116 is at reduced pressure. As used in this specification and the appended claims, the term "reduced pressure" means a pressure less than about 100 Torr, or less than about 75 Torr, or less than about 50 Torr, or less than about 25 Torr. For example, "medium pressure" defined as in the range of about 1 Torr to about 25 Torr is reduced pressure.

Any plasma treatment will need to occur uniformly across the wafer as the wafer moves through the plasma region. In the carousel-type embodiment shown in FIG. 2, the wafer is rotating through a plasma region, making exposure to the plasma across the wafer surface more variable than for a linearly moving wafer. One method to ensure uniformity of the plasma process is to have a "wedge-shaped" or "pie-shaped" (circular sector) plasma region of uniform plasma density, as shown in FIG. 3. The embodiment of FIG. 3 shows a simple platen structure, also referred to as a susceptor or susceptor assembly, with a single wafer 60. As the susceptor 66 rotates the wafer 60 along an arcuate path 18, the wafer 60 passes through a plasma region 68 which has a wedge-shape. Because the susceptor is rotating about the axis 69, different portions of the wafer 60 will have different annular velocities, with the outer peripheral edge of the wafer moving faster than the inner peripheral edge. Therefore, to ensure that all portions of the wafer have about the same residence time in the plasma region, the plasma region is wider at the outer peripheral edge than at the inner peripheral edge.

Some embodiments of the invention are directed to processing chambers comprising at least one capacitively coupled wedge-shaped plasma source 100 positioned along an arcuate path in a processing chamber. As used in this specification and the appended claims, the term "arcuate path" means any path which travels at least a portion of a circular-shaped or an oval-shaped path. The arcuate path can include the movement of the substrate along a portion of the path of at least about 5°, 10°, 15°, 20°, Referring to FIGS. 9 through 12, an embodiment of a plasma source assembly with a wedge-shaped housing 110 is shown. Here, the housing has an inner peripheral edge 118 and an outer peripheral edge 119 with two elongate sides 117. The inner peripheral edge 118 of the wedge-shaped portions is narrower than the outer peripheral edge 119. Each of the RF hot electrode 120, the dielectric spacer 170 and the grounded plate 180 are wedge-shaped having an inner peripheral edge and an outer peripheral edge and two elongate sides.

Figure 9:
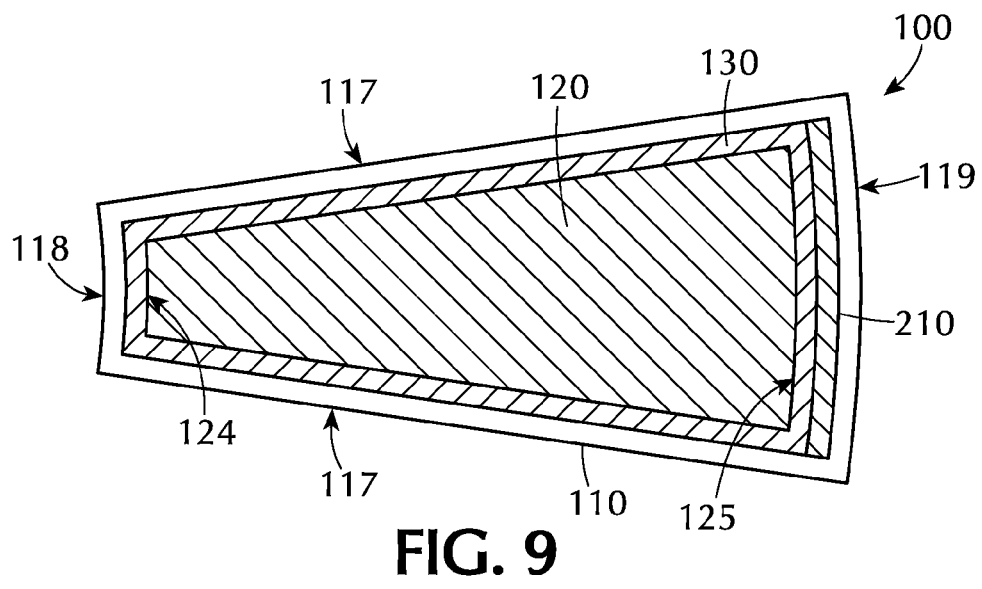
FIG. 9 shows a schematic view of a portion of a wedge-shaped plasma source assembly in accordance with one or more embodiment of the invention.

FIG. 9 shows a view of a wedge-shaped plasma source assembly 100 with a wedge-shaped housing 110. The RF hot electrode 120 and end dielectric 130 are shown. The first end 124 of the RF hot electrode 120 defines the inner peripheral edge 118 and the second end 125 defines the outer peripheral edge of the RF hot electrode 120 and the housing 110. In the embodiment shown in FIG. 9, the RF hot electrode 120 is surrounded on the inner peripheral edge 118, the outer peripheral edge 119 and each side 117 by an end dielectric 130. A wedge spring 210 is positioned along the outer peripheral edge 119 of the RF hot electrode 120. The wedge spring 210 allows expansive movement of the RF hot electrode 120 in a direction away from the inner peripheral edge 118, so that expansion occurs substantially in the direction toward the outer peripheral edge 119. The wedge spring 210 of some embodiments, resembles a piece of corrugated sheet metal. In some embodiments, the wedge spring 210 provides grounding of the grounded connection 140 to the body of the plasma source.

Figure 10:
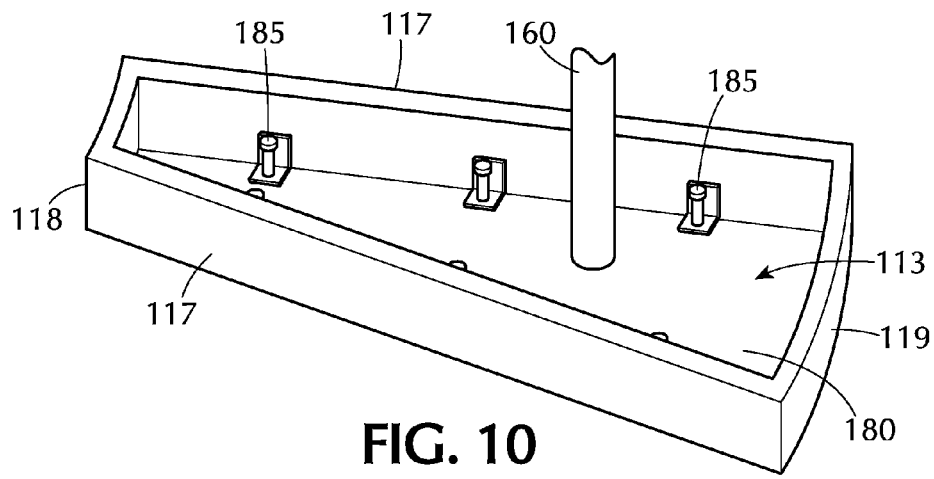
FIG. 10 shows a partial perspective view of a wedge-shaped plasma source assembly in accordance with one or more embodiment of the invention.

FIG. 10 shows a perspective view of the top portion of a wedge-shaped plasma source assembly 100. The coaxial RF feed line 160 can connect to any suitable portion of the assembly 100 to provide a uniform electric field across the RF hot electrode 120. In the embodiment shown in FIGS. 10 and 11, the coaxial RF feed line 160 connects to the RF hot electrode at a point between the elongate sides 117 but closer to the outer peripheral edge 119 than the inner peripheral edge 118. The point of connection can be, for example, a center of mass of the RF hot electrode 120, or a portion of the device in which the current density across the RF hot electrode 120 is substantially uniform.

Figure 11:
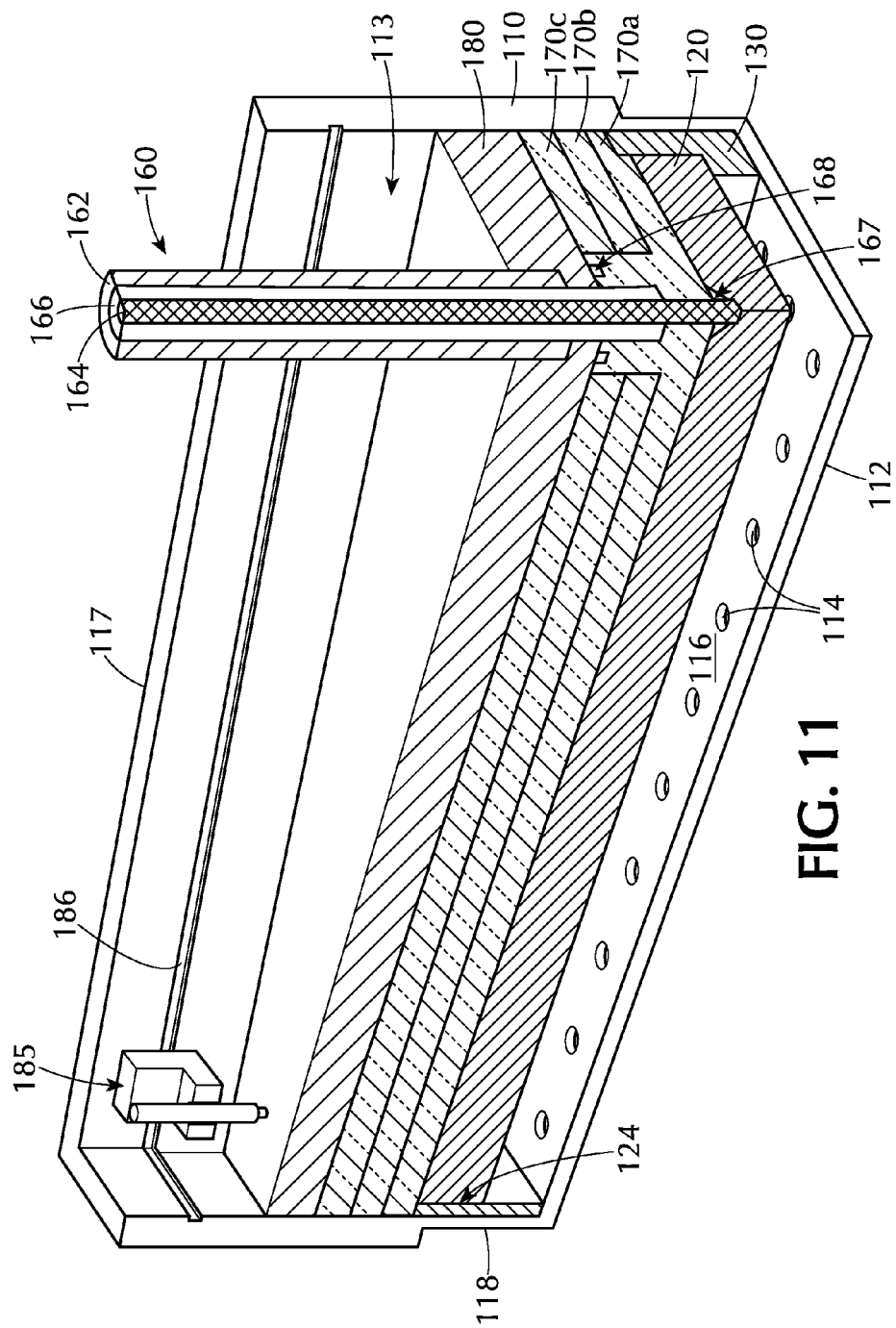
FIG. 11 shows cross-sectional perspective view of a wedge-shaped plasma source assembly in accordance with one or more embodiment of the invention.

The embodiment shown in FIG. 10 excludes a top so that the gas volume 113 and the top of the grounded plate 180 can be seen. Additionally, the compression elements 185 which provide directed force to the back side of the grounded plate 180 can be seen. These compression elements 185 are shown in the gas volume 113, but it will be understood that this is merely one possible configuration and that the compression elements 185 can be isolated from the gas volume 113. FIG. 11 shows a cut-away of the embodiment in FIG. 10 along the central axis of the coaxial RF feed line 160. A single compression element 185 is shown in cooperative arrangement with a track 186. This track 186 allows the compression elements 185 to be moved along the length of the sides 117 or the inner peripheral edge 118 or the outer peripheral edge (not shown) so that the compressive force applied to the grounded plate 180 can be unified across the entire grounded plate 180.

Figure 12:
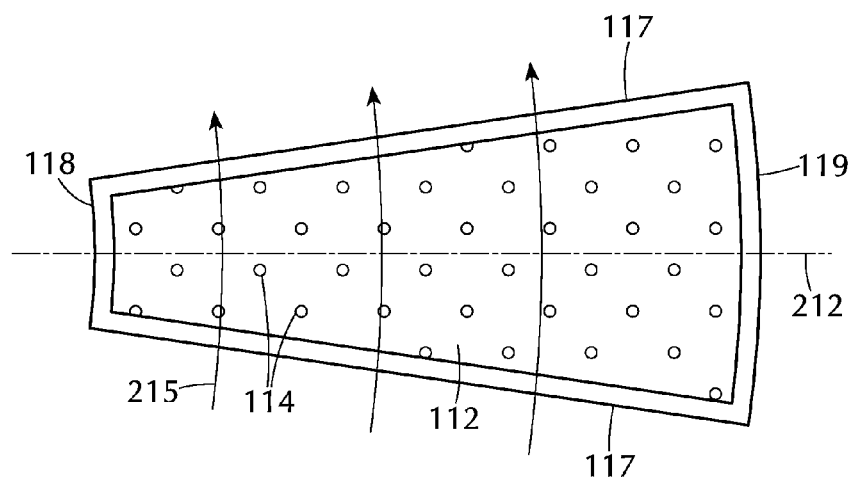
FIG. 12 shows a front view of a wedge-shaped plasma source assembly in accordance with one or more embodiment of the invention.

FIG. 12 shows a front view of another embodiment of a wedge-shaped plasma source assembly 100. Here, the arrangement of plurality of apertures 114 can be seen. In the embodiment shown, the apertures 114 are evenly distributed in rows which are angled relative to the central axis 212 of the front face 112. Stated differently, the front face 112 of the housing 110 has a plurality of apertures 114 which form a hole pattern that is rotated at an angle relative to the central axis 212, also referred to as the elongate axis, of the housing. The direction of movement of the wafer across the surface of the plasma source assembly is shown with arrows 215. The line of apertures 114 can be angled relative to the central axis 212 so that any given point on the surface of the substrate does not "see" a line of apertures while traversing the plasma source. This may provide a more uniform plasma exposure without striping evident in the final product.

Additional embodiments of the invention are directed to methods of processing a plurality of substrates. The plurality of substrates is loaded onto substrate support in a processing chamber. The substrate support is rotated to pass each of the plurality of substrates across a gas distribution assembly to deposit a film on the substrate. The substrate support is rotated to move the substrates to a plasma region adjacent an capacitively coupled pie-shaped plasma source generating substantially uniform plasma in the plasma region. This can be repeated until a film of predetermined thickness is formed.

Rotation of the carousel can be continuous or discontinuous. In continuous processing, the wafers are constantly rotating so that they are exposed to each of the injectors in turn. In discontinuous processing, the wafers can be moved to the injector region and stopped, and then to the region 84 between the injectors and stopped. For example, the carousel can rotate so that the wafers move from an inter-injector region across the injector (or stop adjacent the injector) and on to the next inter-injector region where the carousel can pause again. Pausing between the injectors may provide time for additional processing between each layer deposition (e.g., exposure to plasma).

The frequency of the plasma may be tuned depending on the specific reactive species being used. Suitable frequencies include, but are not limited to, 2 MHz, 13.56 MHz, 40 MHz, 60 MHz and 100 MHz.

According to one or more embodiments, the substrate is subjected to processing prior to and/or after forming the layer. This processing can be performed in the same chamber or in one or more separate processing chambers. In some embodiments, the substrate is moved from the first chamber to a separate, second chamber for further processing. The substrate can be moved directly from the first chamber to the separate processing chamber, or the substrate can be moved from the first chamber to one or more transfer chambers, and then moved to the separate processing chamber. Accordingly, the processing apparatus may comprise multiple chambers in communication with a transfer station. An apparatus of this sort may be referred to as a "cluster tool" or "clustered system", and the like.

Generally, a cluster tool is a modular system comprising multiple chambers which perform various functions including substrate center-finding and orientation, degassing, annealing, deposition and/or etching. According to one or more embodiments, a cluster tool includes at least a first chamber and a central transfer chamber. The central transfer chamber may house a robot that can shuttle substrates between and among processing chambers and load lock chambers. The transfer chamber is typically maintained at a vacuum condition and provides an intermediate stage for shuttling substrates from one chamber to another and/or to a load lock chamber positioned at a front end of the cluster tool. Two well-known cluster tools which may be adapted for the present invention are the Centura® and the Endura®, both available from Applied Materials, Inc., of Santa Clara, Calif. The details of one such staged-vacuum substrate processing apparatus are disclosed in U.S. Pat. No. 5,186,718, entitled "Staged-Vacuum Wafer Processing Apparatus and Method," Tepman et al., issued on Feb. 16, 1993. However, the exact arrangement and combination of chambers may be altered for purposes of performing specific processes as described herein. Other processing chambers which may be used include, but are not limited to, cyclical layer deposition (CLD), atomic layer deposition (ALD), chemical vapor deposition (CVD), physical vapor deposition (PVD), etch, preclean, chemical clean, thermal treatment such as RTP, plasma nitridation, degas, orientation, hydroxylation and other substrate processes. By carrying out processes in a chamber on a cluster tool, surface contamination of the substrate with atmospheric impurities can be avoided without oxidation prior to depositing a subsequent film.

According to one or more embodiments, the substrate is continuously under vacuum or "load lock" conditions, and is not exposed to ambient air when being moved from one chamber to the next. The transfer chambers are thus under vacuum and are "pumped down" under vacuum pressure. Inert gases may be present in the processing chambers or the transfer chambers. In some embodiments, an inert gas is used as a purge gas to remove some or all of the reactants after forming the layer on the surface of the substrate. According to one or more embodiments, a purge gas is injected at the exit of the deposition chamber to prevent reactants from moving from the deposition chamber to the transfer chamber and/or additional processing chamber. Thus, the flow of inert gas forms a curtain at the exit of the chamber.

During processing, the substrate can be heated or cooled. Such heating or cooling can be accomplished by any suitable means including, but not limited to, changing the temperature of the substrate support (e.g., susceptor) and flowing heated or cooled gases to the substrate surface. In some embodiments, the substrate support includes a heater/cooler which can be controlled to change the substrate temperature conductively. In one or more embodiments, the gases (either reactive gases or inert gases) being employed are heated or cooled to locally change the substrate temperature. In some embodiments, a heater/cooler is positioned within the chamber adjacent the substrate surface to convectively change the substrate temperature.

The substrate can also be stationary or rotated during processing. A rotating substrate can be rotated continuously or in discreet steps. For example, a substrate may be rotated throughout the entire process, or the substrate can be rotated by a small amount between exposures to different reactive or purge gases. Rotating the substrate during processing (either continuously or in steps) may help produce a more uniform deposition or etch by minimizing the effect of, for example, local variability in gas flow geometries.

While the foregoing is directed to embodiments of the present invention, other and further embodiments of the invention may be devised without departing from the basic scope thereof, and the scope thereof is determined by the claims that follow.

What is claimed is:

1. A modular plasma source assembly comprising:
   an elongate housing having a side wall, an electrically grounded front face and a gas volume;
   an elongate RF hot electrode within the housing, the elongate RF hot electrode having a front face, a back face, elongate sides and a first end and a second end defining an elongate axis, the elongate RF hot electrode spaced from the front face to form a gap between the front face of the RF hot electrode and the front face of the elongate housing;
   an end dielectric in contact with each of the first end and the second end of the RF hot electrode and between the RF hot electrode and the side wall;
   a sliding ground connection positioned at one or more of the first end and the second end of the RF hot electrode opposite the end dielectric, the sliding ground connection isolated from direct contact with the RF hot electrode by the end dielectric;
   a seal foil positioned at each sliding ground connection opposite the end dielectric, the seal foil forming an electrical connection between the front face of the elongate housing and the sliding ground connection; and
   a coaxial RF feed line passing through the elongate housing, the coaxial RF feed line including an outer conductor and an inner conductor separated by an insulator, the outer conductor in communication with electrical ground and the inner conductor in electrical communication with the elongate RF hot electrode.

2. The modular plasma source assembly of claim 1, further comprising:
a dielectric spacer within the housing and positioned adjacent the back face of the elongate RF hot electrode; and
a grounded plate within the housing and positioned on an opposite side of the dielectric spacer from the RF hot electrode, the grounded plate connected to electrical ground.

3. The modular plasma source assembly of claim 2, wherein the outer conductor of the coaxial RF fee line is connected to the grounded plate.

4. The modular plasma source assembly of claim 2, further comprising a plurality of compression elements to provide compressive force to the grounded plate in the direction of the dielectric spacer.

5. The modular plasma source assembly of claim 2, wherein each of the dielectric spacer and the RF hot electrode comprise a plurality of holes therethrough so that a gas in the gas volume can pass through the dielectric spacer and the RF hot electrode into the gap.

6. The modular plasma source assembly of claim 2, wherein the inner conductor extends through a channel in the grounded plate and the dielectric spacer and connects to the elongate RF hot electrode.

7. The modular plasma source assembly of claim 6, further comprising an RF hot electrode vacuum seal around the inner conductor at the connection to the elongate RF hot electrode and a dielectric vacuum seal around the channel at an interface of the dielectric spacer and the grounded plate so that the channel extending through the grounded plate is at atmospheric pressure when the gap is at reduced pressure.

8. The modular plasma source assembly of claim 2, wherein the housing and each of the RF hot electrode, dielectric spacer and grounded plate are wedge-shaped with an inner peripheral edge, and outer peripheral edge and two elongate sides, the first end defining the inner peripheral edge and the second end defining the outer peripheral edge of the housing.

9. The modular plasma source assembly of claim 8, wherein the front face of the housing comprises a plurality of openings therethrough, the plurality of openings forming a hole pattern rotated at an angle to the elongate axis of the housing.

10. A modular plasma source assembly comprising:
an elongate housing having a side wall, an electrically grounded front face and a gas volume;
an elongate RF hot electrode within the housing, the elongate RF hot electrode having a front face, a back face, elongate sides and a first end and a second end defining an elongate axis, the elongate RF hot electrode and spaced from the front face to form a gap between the front face of the RF hot electrode and the front face of the elongate housing;
a dielectric spacer within the housing and positioned adjacent the back face of the elongate RF hot electrode;
a grounded plate within the housing and positioned on an opposite side of the dielectric spacer from the RF hot electrode, the grounded plate connected to electrical ground;
a channel extending through the grounded plate and the dielectric spacer; and
a coaxial RF feed line passing through the elongate housing, the coaxial RF feed line including an outer conductor and an inner conductor separated by an insulator, the outer conductor in electrical communication with grounded plate and the inner conductor passing through the channel in the grounded plate and the dielectric spacer and in electrical communication with the elongate RF hot electrode, wherein the channel is at atmospheric pressure when the gap is at reduced pressure.

11. The modular plasma source assembly of claim 10, further comprising:
an end dielectric in contact with each of the first end and the second end of the RF hot electrode and between the RF hot electrode and the side wall;
a sliding ground connection positioned at one or more of the first end and the second end of the RF hot electrode opposite the end dielectric, the sliding ground connection isolated from direct contact with the RF hot electrode by the end dielectric; and
a seal foil positioned at each sliding ground connection opposite the end dielectric, the seal foil forming an electrical connection between the front face of the elongate housing and the sliding ground connection.

12. The modular plasma source assembly of claim 11, further comprising a plurality of compression elements to provide compressive force to the grounded plate in the direction of the dielectric spacer.

13. The modular plasma source assembly of claim 11, wherein each of the dielectric spacer and the RF hot electrode comprise a plurality of holes therethrough so that a gas in the gas volume can pass through the dielectric spacer and the RF hot electrode into the gap.

14. A modular plasma source assembly comprising:
a wedge-shaped elongate housing including an inner peripheral end, an outer peripheral end, two side walls connecting the inner peripheral end and the outer peripheral end, an electrically grounded front face comprising a plurality of openings therethrough and a gas volume;
a wedge-shaped RF hot electrode within the housing having a body with a front surface, a back surface, elongate sides, a first end adjacent the inner peripheral end and a second end adjacent the outer peripheral end, the front surface of the RF hot electrode spaced from the front face of the housing to form a gap;
an end dielectric in contact with each of the first end and the second end of the RF hot electrode;
a sliding ground connection positioned at the second end of the RF hot electrode opposite the end dielectric, the sliding ground connection isolated from direct contact with the RF hot electrode by the end dielectric;
a seal foil positioned adjacent the sliding ground connection opposite the end dielectric, the seal foil forming an electrical connection between the front face of the elongate housing and the sliding ground connection; and
a coaxial RF feed line passing through the elongate housing, the coaxial RF feed line including an outer conductor and an inner conductor separated by an insulator, the outer conductor in communication with electrical ground and the inner conductor in electrical communication with the RF hot electrode.

15. The modular plasma source assembly of claim 14, further comprising:
a wedge-shaped dielectric spacer within the housing and positioned adjacent the back surface of the RF hot electrode; and
a wedge-shaped grounded plate within the housing and positioned on an opposite side of the dielectric spacer from the RF hot electrode, the grounded plate connected to electrical ground.

16. The modular plasma source assembly of claim 15, wherein the outer conductor of the coaxial RF fee line is connected to the grounded plate.

17. The modular plasma source assembly of claim 15, further comprising a plurality of compression elements to provide compressive force to the grounded plate in the direction of the dielectric spacer.

18. The modular plasma source assembly of claim 15, wherein each of the dielectric spacer and the RF hot electrode comprise a plurality of holes therethrough so that a gas in the gas volume can pass through the dielectric spacer and the RF hot electrode into the gap.

19. The modular plasma source assembly of claim 18, wherein the dielectric spacer comprises two or more dielectric spacer layers, each dielectric spacer layer having a plurality of holes therethrough.

20. The modular plasma source assembly of claim 19, wherein the plurality of holes in each of the dielectric spacer layers is offset from the plurality of holes in the adjacent dielectric spacer layer and at least one channel is formed on a back side of each dielectric spacer layer, the at least one channel forming a fluid connection between the plurality of holes in each of the dielectric spacer layers with the adjacent dielectric spacer layer or RF hot electrode.

\* \* \* \* \*